(12) United States Patent
Lee

(10) Patent No.: US 7,108,750 B2
(45) Date of Patent: Sep. 19, 2006

(54) THINNING AGENT SUPPLYING SYSTEMS

(75) Inventor: Su Hyung Lee, Icheon-Si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 2 days.

(21) Appl. No.: 10/458,870

(22) Filed: Jun. 11, 2003

(65) Prior Publication Data

US 2003/0226854 A1   Dec. 11, 2003

(30) Foreign Application Priority Data

Jun. 11, 2002   (KR) .................. 10-2002-0032611

(51) Int. Cl.
   *B05C 11/00* (2006.01)
(52) U.S. Cl. .................... 118/610; 96/155
(58) Field of Classification Search ............ 118/612, 118/52, 693, 694, 712, 600, 610, 320; 96/155, 96/241, 156, 220; 222/389, 399; 137/255, 137/256
   See application file for complete search history.

(56) References Cited

U.S. PATENT DOCUMENTS

| | | | | |
|---|---|---|---|---|
| 3,638,831 A | * | 2/1972 | Pauwels et al. ............ 222/1 |
| 3,786,966 A | * | 1/1974 | Behunin et al. ............ 222/387 |
| 4,622,239 A | * | 11/1986 | Schoenthaler et al. ........ 427/8 |
| 4,887,651 A | * | 12/1989 | Santiago ................... 141/1 |
| 5,366,309 A | * | 11/1994 | Springall ................ 401/48 |
| 5,480,487 A | * | 1/1996 | Figini et al. ............. 118/610 |
| 5,570,813 A | * | 11/1996 | Clark, II .................. 222/1 |
| 5,584,416 A | * | 12/1996 | Florian .................... 222/1 |
| 2002/0186613 A1 | | 12/2002 | Hiraoka et al. | |

FOREIGN PATENT DOCUMENTS

| JP | 2002-66431 | 3/2002 |
|---|---|---|
| KR | 1995-4575 | 3/1995 |

* cited by examiner

*Primary Examiner*—Brenda A. Lamb
(74) *Attorney, Agent, or Firm*—Saliwanchik, Lloyd & Saliwanchik

(57) ABSTRACT

Thinning agent supplying systems for use with spin-coating machines are disclosed. An example supplying system enables the stable supply of thinning agent for cleaning a wafer. The example system includes an input terminal; first and second tanks for receiving the thinning agent from the input terminal; first and second valves for controlling discharge of the thinning agent from the first and second tanks; a pressure-exerting unit for applying pressurized gas to discharge the thinning agent from the first and/or second tanks; and a de-gas unit for removing bubbles from the thinning agent discharged from the first and/or second tanks.

5 Claims, 4 Drawing Sheets

THINNING AGENT SUPPLYING SYSTEMS

FIELD OF THE DISCLOSURE

The present disclosure relates generally to semiconductor devices, and more particularly to thinning agent supplying systems for manufacturing semiconductor devices.

BACKGROUND

Generally, a semiconductor device may be formed by depositing multiple layers of thin films such as a poly-silicon layer, an oxide layer, a nitride layer and/or a metallic layer on a wafer and forming a pattern thereon after a photolithography process, an etching process, a diffusion process and/or an ion implantation process.

The photolithography process is a core technology for manufacturing semiconductor devices. In the photolithography process an integrated circuit pattern may be formed on a wafer by exposing a photo mask with a micro circuit formed therein to a certain light source. Light sources that are currently used in known photolithography processes include g line, I line, Deep Ultra Violet (DUV), KrF laser, etc. Photolithography processes use a photo resist layer, which consists of photosensitive polymer whose solubility changes in response to light exposure.

When exposed to light through the photo mask, the portion of the photo resist layer which is exposed to light is changed into soluble material or insoluble material in comparison with a portion of the photo resist layer that is not exposed to light. The soluble or insoluble materials respectively form positive or negative patterns in the photo resist layer if they are developed by a developing solution. The pattern formed in the photo resist layer serves as a mask in a post-photolithography process such as, for example, an etching process or an ion implantation process, etc.

The photo resist layer is generally coated on a wafer by a conventional spin coating apparatus such as the apparatus 100 shown in FIG. 1. The spin coating apparatus 100 comprises a chuck 10 for holding a wafer 1 using vacuum suction, a vertical drive axis 20 connected to a lower portion of the chuck 10, a spin driver 30 installed on one side of the vertical rotation axis 20, a carrier arm 40 for supplying resist solution, a carrier arm 50 for top edge bead removal (TEBR), and a nozzle 60 for back side rinse (BSR). The carrier arm 40 carries a nozzle unit 41 and is installed such that it can be horizontally and vertically moved so as to inject the resist solution (which is not shown) on an upper portion of the wafer 1 through the nozzles 42 of the nozzle unit 41. The carrier arm 50 for TEBR carries a nozzle unit 51 and is installed such that it can be horizontally and vertically moved so as to downwardly inject a solution (e.g., a thinning agent such as a solvent) for TEBR, on the upper portion of the wafer 1 through the nozzle 52. Also, the nozzle 60 for BSR is installed so as to upwardly inject a solution (e.g., a thinning agent such as a solvent) for BSR to a lower portion of the wafer 1.

The spin coating apparatus 100 of FIG. 1 spin-coats a photo resist layer (which is not shown) on a wafer 1 in accordance with the process illustrated in FIG. 2. That is, when the wafer 1 is positioned on the chuck 10 and secured thereto with vacuum suction, the vertical rotation axis 20 is rotated at high speed (e.g., in the clockwise direction) by a driving force applied by the spin driver 30 (Step S11). The wafer 1 is simultaneously rotated (e.g., in clockwise direction) together with the chuck 10. In the illustrated example, the wafer 1 is vacuum-sucked onto the chuck 10 such that its upper portion, (e.g., the surface on which a semiconductor device is to be formed), faces upward.

While the wafer 1 is rotated at a constant speed, the carrier arm 40 moves the nozzle unit 41 generally horizontally forward toward the chuck 10 to position the nozzles 42 vertically above the wafer 1 and then moves the nozzle unit 41 generally vertically downward to lower the nozzles 42 to a certain level above the wafer 1. Then, a certain amount of resist solution is downwardly injected onto a center region of the upper surface of the wafer 1 through the nozzles 42 of the nozzle unit 41. (Step S13). The nozzle unit 41 is then returned to its original position by the carrier arm 40. Since the wafer 1 is rotated at high speed, centrifugal forces spread the resist solution outward from the center region of the wafer 1 to the outer edge portion of the wafer 1 to coat the entire surface of the wafer 1 so as to form a photo resist layer having a uniform thickness.

When the photo resist layer is formed, contaminants such as dregs of the photo resist layer are likely to be left on the upper edge portion and the lower portion of the wafer 1. Such contaminants should be removed so as to prevent defects during post-processing.

To this end, the carrier arm 50 for TEBR moves the nozzle unit 51 generally horizontally forward to the upper edge of the wafer 1 and then moves the nozzle unit 51 generally vertically downward to lower the nozzle 52 to a certain level above the wafer 1. Then, a certain amount of TEBR solution (e.g., a thinning agent) is downwardly injected on the edge of the wafer 1 through the nozzle 52. (Step S15). The nozzle 52 is then returned to its original position by the carrier arm 50. Also, a certain amount of BSR solution (e.g., a thinning agent) is upwardly injected onto the edge of the wafer 1 through the nozzle 60. (Step S15).

Since the wafer 1 is rotated at high speed, a uniform width (e.g., about 3 mm) of the photo resist layer on the upper edge of the wafer 1 is removed together with contaminants of the photo resist layer on the lower portion of the wafer 1. This removal is carried out in order to remove contaminants such as dregs of the photo resist layer that may have been left on the upper edge and the lower portion of the wafer 1. The thinning agents for TEBR and BSR use the same kind of thinning agent (e.g., a solvent, etc).

When the TEBR and BSR processes are terminated, the spin driver 30 stops rotating the vertical rotation axis 20. The wafer 1 then stops rotating together with the chuck 10. (Step S17) The coating process of the photo resist layer for one wafer 1 is thus terminated.

The thinning agents supplied to the nozzles 305, 306 for TEBR and BSR are supplied by a thinning agent supplying system. A conventional thinning agent supplying system is constructed as shown in FIG. 3. The system of FIG. 3 comprises an input terminal 301 for receiving and supplying thinning agent, a storage tank 302 for receiving and storing thinning agent from the input terminal 301, a supply tank 303 for directly supplying thinning agent to the nozzles 305, 306 for TEBR and BSR, and a pump 304 for drawing thinning agent from the supply tank 303 and supplying the thinning agent to the nozzles 305, 306 for TEBR and BSR.

The storage tank 302 and the supply tank 303 have scale marks by which one identifies the respective level of thinning agent as "L (low)" and "H (high)". When the thinning agent in the storage tank 302 reaches the scale mark "L" of the storage tank 302, thinning agent is supplied from the input terminal 301 to the storage tank 302 until the level of agent reaches up to the "H" mark in the storage tank 302. When the thinning agent in the storage tank 303 reaches the "L" scale mark, thinning agent is supplied from the storage tank 302 to the supply tank 303 until the level of agent reaches up to the "H" mark. In other words, when the level of thinning agent in a respective tank 302, 303 falls to the "L" scale mark level, the respective tank 302, 303 receives additional thinning agent from its corresponding supply source until the tank 302, 303 is again filled to the "H" level.

The thinning agent drawn by the pump 304 is supplied from the tank 303 to the nozzles 305 and 306 for TEBR and BSR through a filter (which is not shown) for removing contaminants.

The thinning agent supplying system of the prior art, however, has certain problems. For example, bubbles are generated in the storage tank 302, the supply tank 303, and the supply pipe which may cause defects during the post-process, TEBR process.

Second, since the pump 304 is driven by $N_2$ gas, fluid flow cannot be uniformly controlled. As a result, bubbles are generated at pump 304 when the pump 304 is driven.

Third, when the thinning agent reaches the "L" scale mark of the supply tank 303, thinning agent is supplied from the storage tank 302. However, the thinning agent in the storage tank 302 may reach the "L" scale mark before the supply tank 303 is refilled. In other words, the storage tank 302 is not always ready to supply thinning agent, which may interrupt smooth supply of the thinning agent.

Fourth, since the thinning agent is supplied from the input terminal 301 to the pump 304 through the storage tank 302 and supply tank 303, there are many places along the supply chain where a problem may occur. As a result, the equipment is subject to frequent breakdowns.

DETAILED DESCRIPTION

Figure 1:
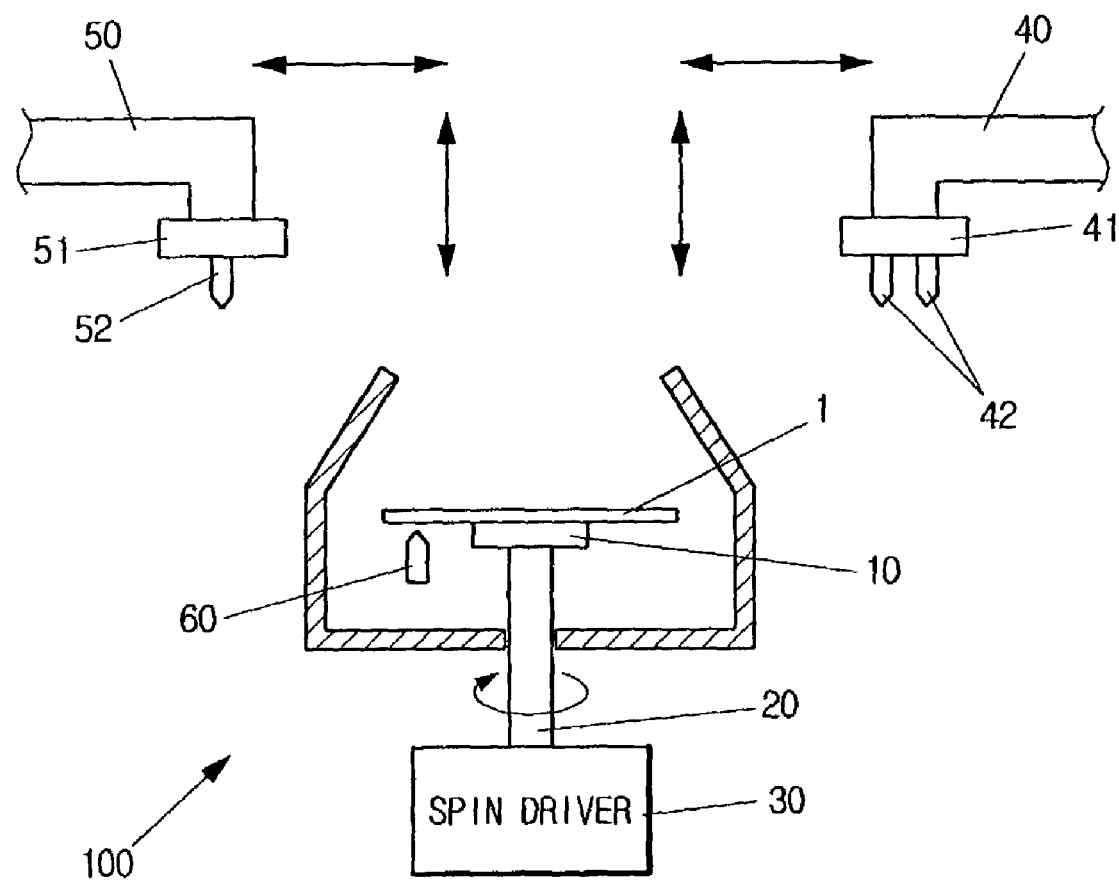
FIG. 1 is a schematic view of a prior art spin coating apparatus.
Figure 2:
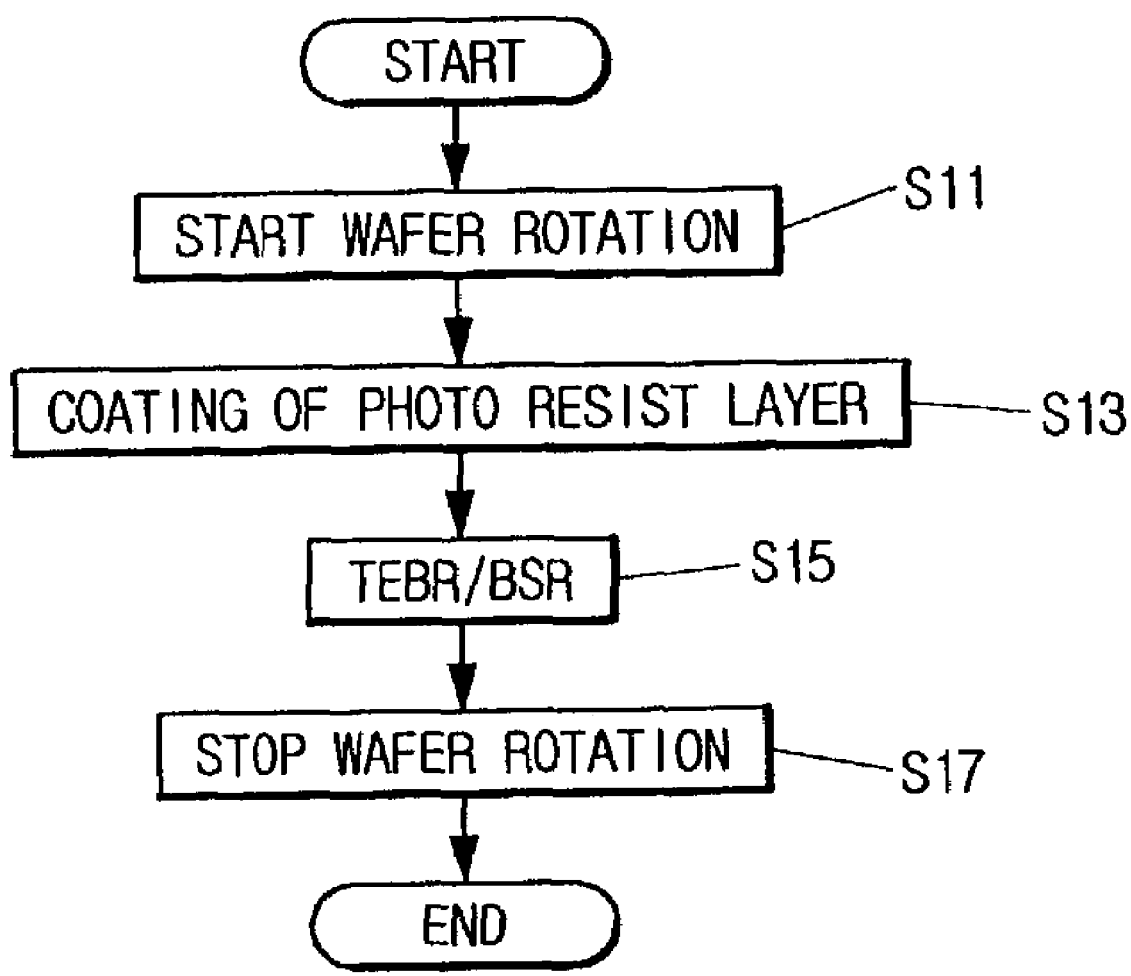
FIG. 2 is a flow chart illustrating a a method of using the conventional spin coating apparatus of FIG. 1 to apply a photo resist layer to a wafer.
Figure 3:
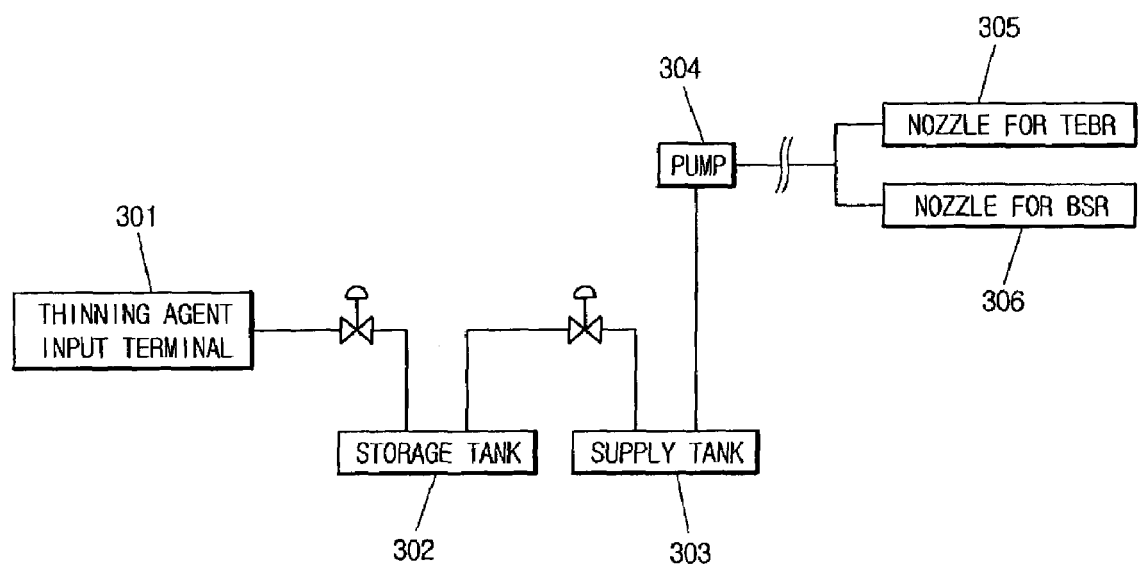
FIG. 3 is a schematic illustration of a conventional thinning agent supplying system.
Figure 4:
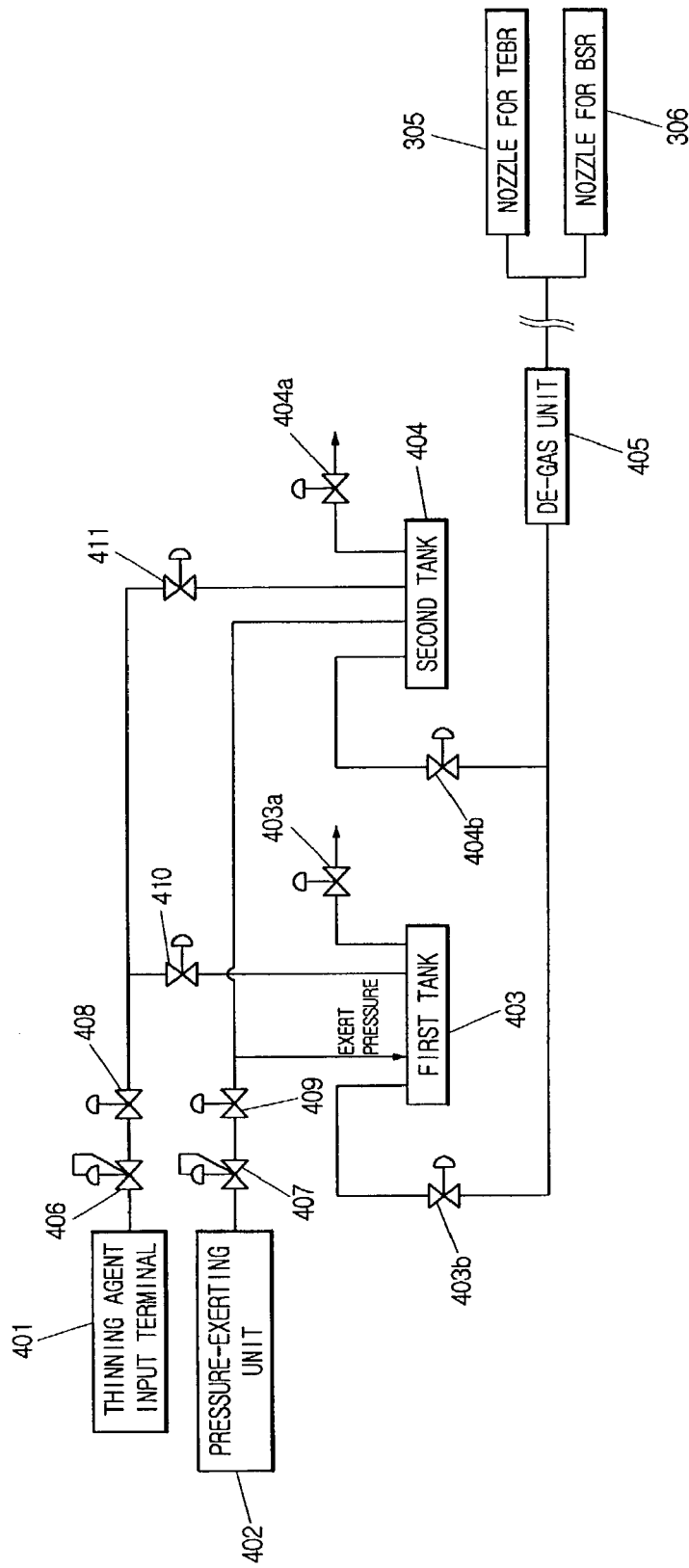
FIG. 4 is a schematic illustration of an example thinning agent supplying system constructed in accordance with the teachings of the invention.

FIG. 4 is a schematic illustration of an example thinning agent supplying system. In the example of FIG. 4, the thinning agent supplying system includes an input terminal 401 to receive and supply thinning agent. It also includes a regulator 406 for regulating the amount of the thinning agent exiting the input terminal 401. The supplying system also includes first and second tanks 403 and 404 for receiving thinning agent from the thinning agent input terminal 401 and for storing the same.

The system further includes introduction valves 410 and 411 between the input terminal 401 of the thinning agent and the first and second tanks 403 and 404 for controlling the introduction of thinning agent. Additionally, the system is provided with discharge valves 403b and 404b at the first and second tanks 403 and 404 for controlling discharge of the thinning agent from the tanks 403, 404. A pressure-exerting unit 402 is provided for introducing pressurized gas into the first and second tanks 403, 404 to discharge the thinning agent from the first and second tanks 403, 404. Further, although they are not shown in the drawing, each of the first and second tanks 403, 404, includes scale marks for identifying the stored amount of the thinning agent and/or sensors for detecting the amount of the thinning agent in the tanks.

The first and second tanks 403, 404 also include ventilation valves 403a, 404a for venting the pressurized gas from the tanks 403, 404 to facilitate discharge of the thinning agent after the thinning agent in the first and second tanks 403, 404 has been discharged and the thinning agent is newly supplied.

In the example thinning agent supplying system of FIG. 4, the thinning agent supplied from the input terminal 401 is simultaneously delivered into the first and second tanks 403, 404. However, the thinning agent in the first tank 403 is discharged before discharging thinning agent from the second tank. When the amount of thinning agent in the first tank 403 is reduced to a certain level, the first tank 403 is blocked to prevent additional discharge of the thinning agent from the first tank 403, and thinning agent is discharged from the second tank 404. At this time, the first tank 403 is then supplied with additional thinning agent from the input terminal 401 until the first tank 403 again stores more than a certain level of thinning agent. As a result of the foregoing, at least one of the first and second tanks 403 and 404 will contain enough thinning agent at any given time to smoothly supply the required amount of thinning agent.

Also, instead of using a pump 304 for discharging the thinning agent, a gas-assist type pressure-exerting unit 402 is used. This has the advantage of reducing generation of bubbles. A de-gas unit 405 is installed for treating possible gas generation. As a result, the supplying system of FIG. 4 supplies high purity thinning agent to a demand unit such as nozzles 305, 306 for TEBR and BSR.

An example manner of operating the thinning agent supplying system of FIG. 4 will now be described in detail.

First, a thinning agent (e.g., a solvent) is simultaneously supplied from the input terminal 401 to the first and second tanks 403 and 404 through the regulator 406. At this time, the introduction valves 410, 411 provided between the first and second tanks 403, 404 and the input terminal 401 control introduction of the thinning agent to the first and second tanks 403, 404. When the thinning agent introduced into the first and second tanks 403, 404 reaches a certain level, the introduction valves 410, 411 are shut off to prevent further introduction of the thinning agent.

The thinning agent is first discharged from the first tank 403. To discharge the tank 403, pressurized gas is supplied from the pressure-exerting unit 402 into the tank. The pressurized gas may be, for example, $N_2$ gas. When the thinning agent discharged from the first tank 403 exceeds a certain level of amount (i.e., when the thinning agent within the tank 403 falls below a predefined level), the discharge valve 403b stops further discharging of the thinning agent from the first tank 403.

When the thinning agent stops discharging from the first tank 403, the thinning agent in the second tank 404 starts discharging and the empty first tank 403 simultaneously receives thinning agent from the input terminal 401 of the thinning agent. That is to say, the first tank 403 is filled while the second tank 404 is discharged and vice versa. Also, before the first tank 403 receives new thinning agent from the input terminal 401 of the thinning agent, the pressurized gas forced into the first tank 403 during the discharging process is vented through the ventilation valve 403b. Similarly, before the second tank 404 is supplied with fresh thinning agent, the pressurized gas is vented therefrom via the valve 404a. This venting process is performed because, if pressurized gas were left in the tank, the tank could not be easily re-supplied with the thinning agent.

Sensors are attached to detect whether or not the thinning agent in the first and second tanks exceeds above or below certain level(s). For example, if a predetermined level is exceeded, a shut-off device prevents use of the first and second tanks 403, 404 until the problem is rectified.

After the discharge source of the thinning agent is changed from the first tank 403 to the second tank 404, the discharge process from the second tank 404 is the same as for the first tank 403.

The thinning agent discharged from the first and/or second tanks 403, 404 passes through the de-gas unit 405 before it reaches the demand unit (e.g., the nozzles 305 and 306 for TEBR and BSR). The de-gas unit 405 preferably removes any remaining micro bubbles from the thinning agent. The thinning agent passed through the de-gas unit 405 may also be supplied to the demand unit (e.g., the nozzles 305 and 306 for TEBR and BSR) through a device such as a filter (which is not shown) for removing contaminants.

The example thinning agent supplying system of FIG. 4 has the following effects. Since the two tanks 403, 404 are serially used, and the empty tank 403 or 404 receives new thinning agent when the thinning agent in the other tank 404 or 403 is discharged, at least one of the first and second tanks 403, 404 always contains sufficient thinning agent to supply the demand units without interruption.

Also, instead of using a pump to discharge the thinning agent as in the prior art, a gas-assist type pressure-exerting unit 402 is used to reduce generation of bubbles. A de-gas unit 405 may also be installed for further reducing possible gas generation, such that the device of FIG. 4 supplies high purity thinning agent to the demand unit(s).

From the foregoing, persons of ordinary skill in the art will appreciate that a system for providing a stable supply of thinning solution to a nozzle or the like in a spin coating machine has been provided. In an example, the system includes an input terminal 401; first and second tanks 403, 404 for receiving and storing the thinning agent from the input terminal 401; first and second valves 403b, 404b for controlling discharge of the thinning agent from the first and second tanks 403, 404; a pressure-exerting unit 402 for applying pressurized gas to facilitate discharge of the thinning agent from the first and second tanks 403, 404; and a de-gas unit 405 for removing bubbles from the thinning agent discharged from the first and second tanks 403, 405.

Also, the illustrated system further includes ventilation valves 403a, 404a for removing pressurized gas from the first and second tanks 403, 404.

The system also includes a regulator 406 for regulating the amount of the thinning agent supplied from the input terminal 401 to the first and second tanks 403, 404.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. For use with a spin coating machine, a thinning agent supplying system for supplying thinning agent for cleaning a wafer, the system comprising:
    an input terminal;
    first and second tanks to receive the thinning agent from the input terminal;
    sensors associated with the first tank and the second tank to detect if more than a predetermined level of the thinning agent is in the first and second tanks and to detect if less than the predetermined level is in the first and second tanks;
    first and second valves to control discharge of the thinning agent from respective ones of the first and second tanks;
    a pressure-exerting unit to apply pressurized gas directly to the thinning agent in at least one of the first and second tanks to discharge the thinning agent from the at least one of the first and second tanks; and
    a de-gas unit to remove bubbles from the thinning agent discharged from the first and second tanks, the first and second tanks being connected in parallel between the pressure-exerting unit and the de-gas unit, and the first and second valves being controlled to reduce the thinning agent to a predetermined level in the first tank as detected by the at least one of sensors before discharging thinning agent from the second tank.

2. A system as defined in claim 1, further comprising a ventilation valve to remove the pressurized gas from one of the first and second tanks.

3. The system as defined in claim 1, further comprising a regulator to regulate the thinning agent supplied from the input terminal to at least one of the first and second tanks.

4. The system as defined in claim 1, wherein the first tank is refilled while the second tank is discharged.

5. The system as defined in claim 4, wherein, after the first tank is refilled, the first and second valves are controlled to reduce the thinning agent to a predetermined level in the second tank as detected by at least one of the sensors before discharging thinning agent from the first tank.

* * * * *